(12) United States Patent
Miyazaki

(10) Patent No.: US 7,759,802 B2
(45) Date of Patent: Jul. 20, 2010

(54) SEMICONDUCTOR DEVICE AND METHOD FOR MANUFACTURING SAME

(75) Inventor: Takashi Miyazaki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 306 days.

(21) Appl. No.: 11/936,120

(22) Filed: Nov. 7, 2007

(65) Prior Publication Data
US 2008/0111249 A1 May 15, 2008

(30) Foreign Application Priority Data
Nov. 9, 2006 (JP) .............................. 2006-304244

(51) Int. Cl.
*H01L 23/48* (2006.01)
(52) U.S. Cl. ............... 257/778; 257/795; 257/E21.503; 438/108; 438/127
(58) Field of Classification Search ................. 257/778, 257/795, E21.503; 438/108, 127
See application file for complete search history.

(56) References Cited

U.S. PATENT DOCUMENTS

2004/0178515 A1* 9/2004 Hilton et al. ................ 257/787
2006/0281220 A1* 12/2006 Kuramochi ................ 438/106

FOREIGN PATENT DOCUMENTS

JP         2004-349399        12/2004

* cited by examiner

*Primary Examiner*—Tu-Tu V Ho
(74) *Attorney, Agent, or Firm*—Young & Thompson

(57) ABSTRACT

In conventional semiconductor devices, an insufficient supply of the resin to the end portions of the components that should be encapsulated is caused, resulting in an insufficient permeation of the resin into gaps between the components and the substrate, causing a spreading resin-wet. A semiconductor device 1 includes a mounting interconnect substrate 10, a semiconductor chip 20 mounted on the mounting interconnect substrate 10, an underfill resin 30 provided in a gap between the mounting interconnect substrate 10 and the semiconductor chip 20 and a flow-inducing section 40 provided in vicinity of the semiconductor chip 20 on the mounting interconnect substrate 10 and being capable of inducing a flow of the underfill resin 30 to the gap.

12 Claims, 15 Drawing Sheets

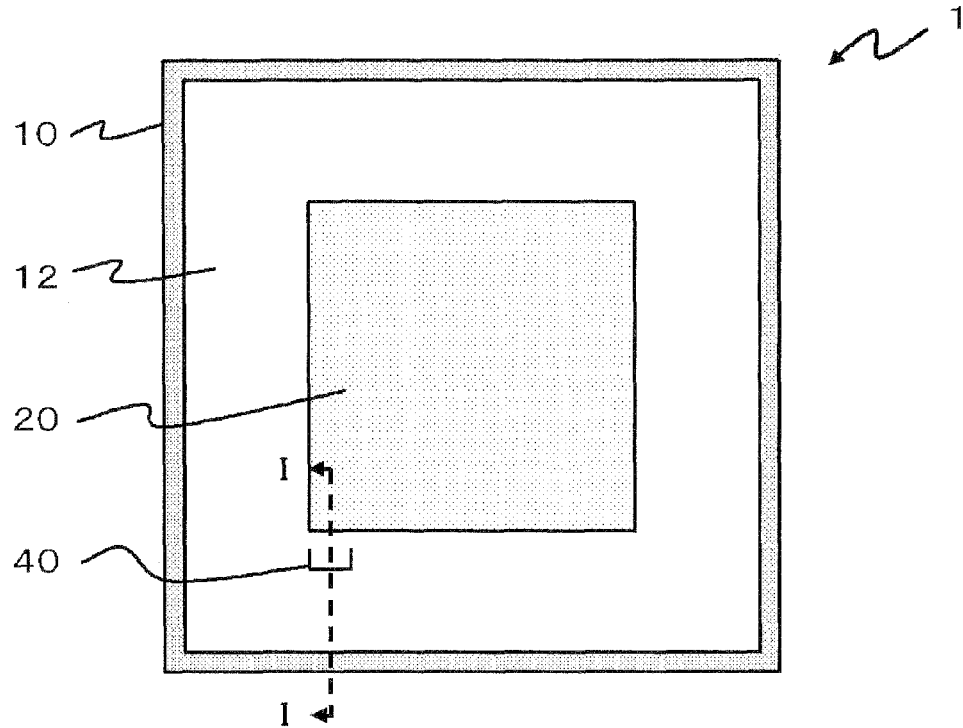
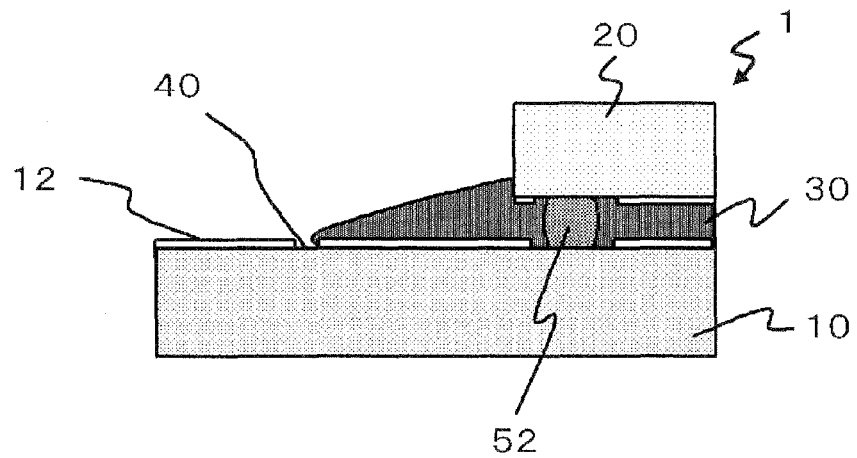

SEMICONDUCTOR DEVICE AND METHOD FOR MANUFACTURING SAME

This application is based on Japanese patent application No. 2006-304,244, the content of which is incorporated hereinto by reference.

BACKGROUND

1. Technical Field

The present invention relates to a semiconductor device and a method for manufacturing thereof.

2. Related Art

The flip-chip coupling technology, which involves arranging a semiconductor chip and an interconnect substrate to an opposed position or semiconductor chips to an opposed position, and then providing a coupling therebetween via a bump electrode, attracts attentions as a package technology that is capable of achieving high-density assembly, miniaturization and sophistication of semiconductor devices. When such flip-chip coupling process is conducted, coupling portions are generally filled with an underfill resin for the purpose of protecting the coupling portion to increase reliability. Typical method for filling the portion with the resin generally includes a process for supplying an underfill resin on an end portion of a flip-chip coupled upper chip, where the supplied resin penetrates through the components by a capillary phenomenon to fill thereof.

As miniaturization and reduced thickness of semiconductor devices is further progressed, it is necessary to inject an underfill resin to a very narrow slit, and on the other hand, since it is also necessary to inhibit a wet-spreading dimension of the supplied underfill resin over the lower components and to inhibit a penetration of the resin to the back surface of the upper chip to be flip-chip bonded, a manner of repeated injection with a smaller amount of underfill resin for several times becomes to be required.

However, smaller amount of the supplied resin causes insufficient supply of the resin to the end portions of the upper chip, causing a failure in a capillary phenomenon. In such case, the rest of the resin that does not permeate into the gaps would be greatly spread in the underlying substrate or in the chip surface, resulting in a larger spreading-wet portion remained around the location that is covered with the resin. Further, the repeatedly supplied resins are then easily penetrated in the places that have already been wetted with the resin, which causes unstable supply of the resin for the components that should be coated therewith, resulting in variations in the performances.

Japanese Patent Laid-Open No. 2004-349,399 discloses a technology for processing a surface of a base substrate, in order to inhibit the unwanted spreading of the underfill resin. In a semiconductor device disclosed in Japanese Patent Laid-Open No. 2004-349,399, an electronic component 102 is flip chip-mounted on a base substrate 100 having a solder resist 101 formed on the surface thereof, as shown in FIG. 13. More specifically, the base substrate 100 is coupled to the electronic component 102 through solder balls 103, and an underfill resin 104 is provided in the gaps therebetween.

The solder resist 101 is provided with an opening 105 formed therein. Such opening 105 is provided so that the components that should be encapsulated (electronic components 102 and 108) are separated from the component 106 that should not be encapsulated, in order to prevent excessive liquid resin from penetrating into the component 106 that should not be encapsulated, as shown in FIG. 14 and FIG. 15.

In the semiconductor device shown in FIG. 13 to FIG. 15, the solder resist is provided with a specified structure, which is presented for the purpose of preventing an excessive liquid resin, which is generated when an excessive amount of the liquid resin is supplied under the components that should be encapsulated, from entering into the components that should not be encapsulated. Hence, such specified structure has a geometry that functions as a simple partition.

However, when a smaller amount of resin is supplied for semiconductor devices having reduced dimensions and thickness, the above-described structure causes an insufficient supply of the resin to the end portions of the components that should be encapsulated, resulting in an insufficient permeation of the resin into gaps between the components and the substrate, causing a spreading resin-wet. This leads to unstable loading of the resin into the above-described gaps.

SUMMARY

According to one aspect of the present invention, there is provided a semiconductor device, comprising: a first electronic component; a second electronic component mounted on the first electronic component; an underfill resin provided in a gap between the first and the second electronic components; and a flow-inducing section provided in vicinity of the second electronic component on the first electronic component, the flow-inducing section being capable of inducing a flow of the underfill resin to the gap.

According to another aspect of the present invention, there is provided a method for manufacturing the semiconductor device, comprising: mounting a second electronic component on a first electronic component; and supplying said underfill resin from a spot between said second electronic component and said inflow inducing section to fill a gap between said first and said second electronic components with the underfill resin.

In the present invention, the flow-inducing section, which serves as inducing a flow of the underfill resin into the gap between the first and the second electronic components is provided in vicinity of the second electronic component. Such manner of actively supplying the underfill resin to the end portion of the second electronic component by utilizing such flow-inducing section ensures a commence of a permeation of the underfill resin to the above-described gap through a capillary phenomenon at the time of starting the supply of the resin. Further, this also allows a fluidization of the subsequently supplied underfill resin, which is applied after the starting the supply, along the spreading direction of the resin toward the above-described gap. Therefore, a phenomenon of causing a spreading-wet of the underfill resin on the first electronic component without permeating into the above-described gap can be prevented.

According to the present invention, the semiconductor device and the method for manufacturing thereof are achieved, which are adopted for sufficiently injecting an underfill resin.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 1A and 1B are a plan view and a cross-sectional view, respectively, both illustrating first embodiment of a semiconductor device according to the present invention;

DETAILED DESCRIPTION

Figure 2A:
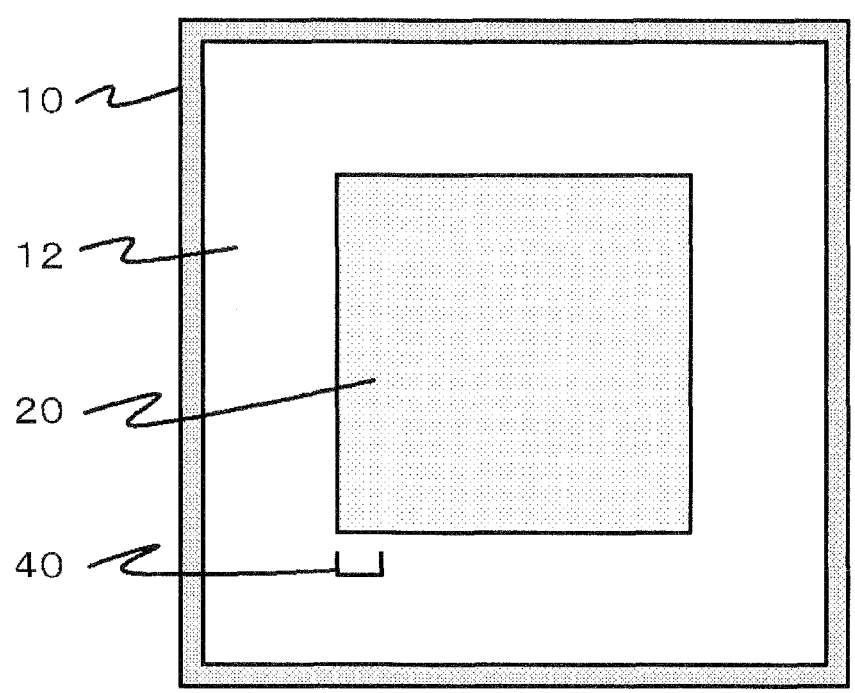
FIGS. 2A and 2B are a plan view and a cross-sectional view, respectively, both useful in describing an embodiment of a method for manufacturing a semiconductor device according to the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable exemplary implementations of semiconductor devices and methods for manufacturing thereof according to the present invention will be described in reference to the annexed figures. In all figures, identical numeral is assigned to an element commonly appeared in the description of the present invention in reference to the figures, and the detailed description thereof will not be repeated.

First Embodiment

FIG. 1A is a plan view, illustrating first embodiment of a semiconductor device according to the present invention. FIG. 1B is a cross-sectional view along line I-I of FIG. 1A. A semiconductor device 1 includes a mounting interconnect substrate 10 (first electronic component), a semiconductor chip 20 mounted on the mounting interconnect substrate 10 (second electronic component), an underfill resin 30 provided in a gap between the mounting interconnect substrate 10 and the semiconductor chip 20 and a flow-inducing section 40 provided in vicinity of the semiconductor chip 20 on the mounting interconnect substrate 10 and being capable of inducing a flow of the underfill resin 30 to the gap.

The semiconductor chip 20 is flip-chip mounted on the mounting interconnect substrate 10. More specifically, the mounting interconnect substrate 10 is coupled to the semiconductor chip 20 through solder balls 52, and a gap formed between the substrate and the chip is filled with the underfill resin 30. In addition to above, though a portion of the underfill resin 30 extends to the outside of the above-described gap as can be seen from FIG. 1B, such extension portion of the resin is not shown in FIG. 1A.

A solder resist 12 is provided on the mounting interconnect substrate 10. The flow-inducing section 40 is provided in vicinity of a corner of the semiconductor chip 20, more specifically in vicinity of a spot where a supply of the underfill resin 30 is started. The flow-inducing section 40 is formed in a form of an opening of the solder resist 12. As can be seen from FIG. 1A, the flow-inducing section 40 has a two-dimensional geometry, in which a concave portion is included in a side of the semiconductor chip 20, and is provided so as to surround the above-described spot from a side opposite to the semiconductor chip 20. In the present embodiment, the flow-inducing section 40 has a two-dimensional geometry that is equivalent to a portion of a rectangle (three sides of the rectangle), and an open-circuit of the flow-inducing section 40 is oriented toward the semiconductor chip 20.

Figure 2B:
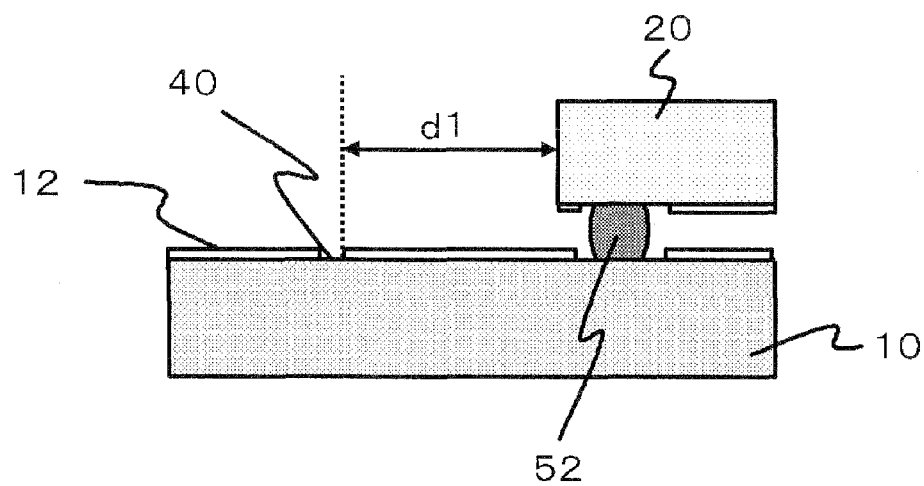

In reference to FIGS. 2A and 2B, FIGS. 3A and 3B, FIGS. 4A and 4B, FIGS. 5A and 5B and FIGS. 6A and 6B, an example of a method for manufacturing the semiconductor device 1 will described, illustrating an embodiment of a method for manufacturing the semiconductor device according to the present invention. FIG. 2A is a plan view corresponding to FIG. 1A, and FIG. 2B is a cross-sectional view corresponding to FIG. 1B. Similar correspondences are also applied for FIGS. 3A and 3B, FIGS. 4A and 4B, FIGS. 5A and 5B and FIGS. 6A and 6B. First of all, the semiconductor chip 20 is flip-chip mounted on the mounting interconnect substrate 10 (FIG. 2A, FIG. 2B).

Figure 3A:
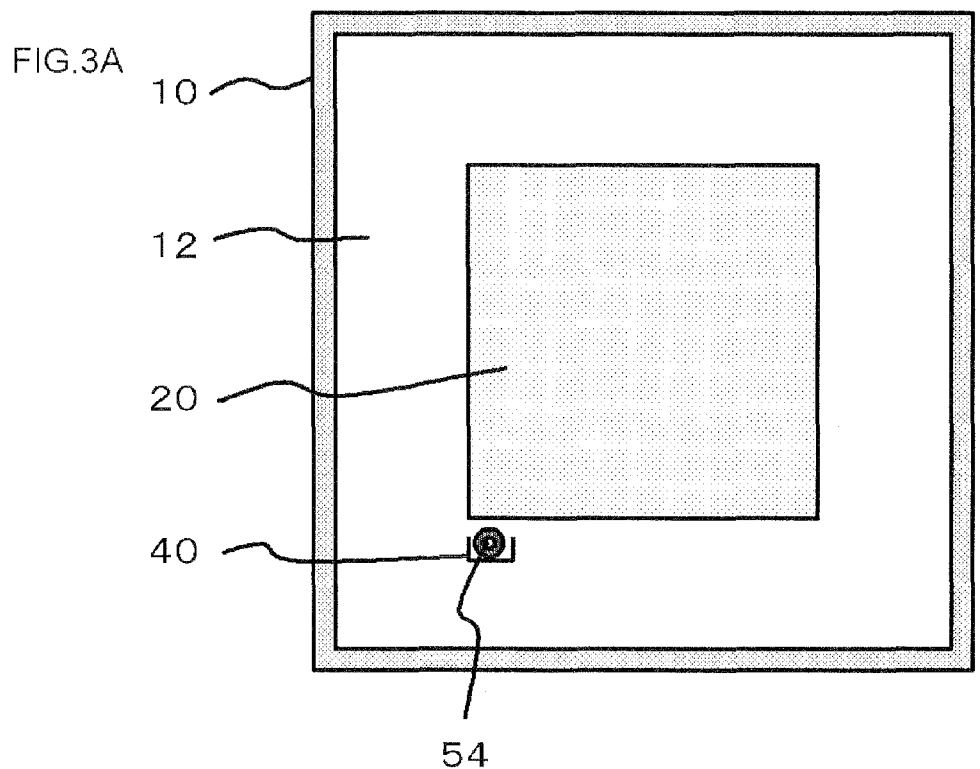
FIGS. 3A and 3B are a plan view and a cross-sectional view, respectively, both useful in describing the embodiment of the method for manufacturing the semiconductor device according to the present invention.
Figure 3B:
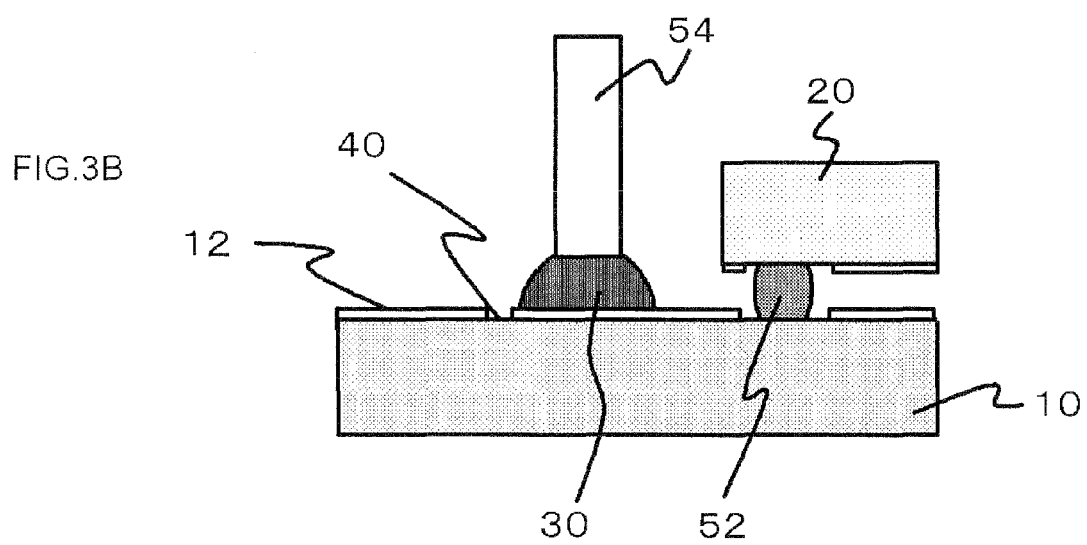

Next, the underfill resin 30 is injected in the gap between the mounting interconnect substrate 10 and the semiconductor chip 20. The supply of the underfill resin 30 is started from a spot between the semiconductor chip 20 and the flow-inducing section 40 (FIG. 3A, FIG. 3B). Therefore, a farthest section in the flow-inducing section 40 from the semiconductor chip 20 is provided at a location farther from the semiconductor chip 20 than a location where a needle 54 is positioned for supplying the underfill resin 30. For example, when the needle 54 having an outer diameter of 300 μm is employed, a distance from the semiconductor chip 20 to the flow-inducing section 40 (distance d1 shown in FIG. 2B) may be preferably about 500 μm.

Figure 4A:
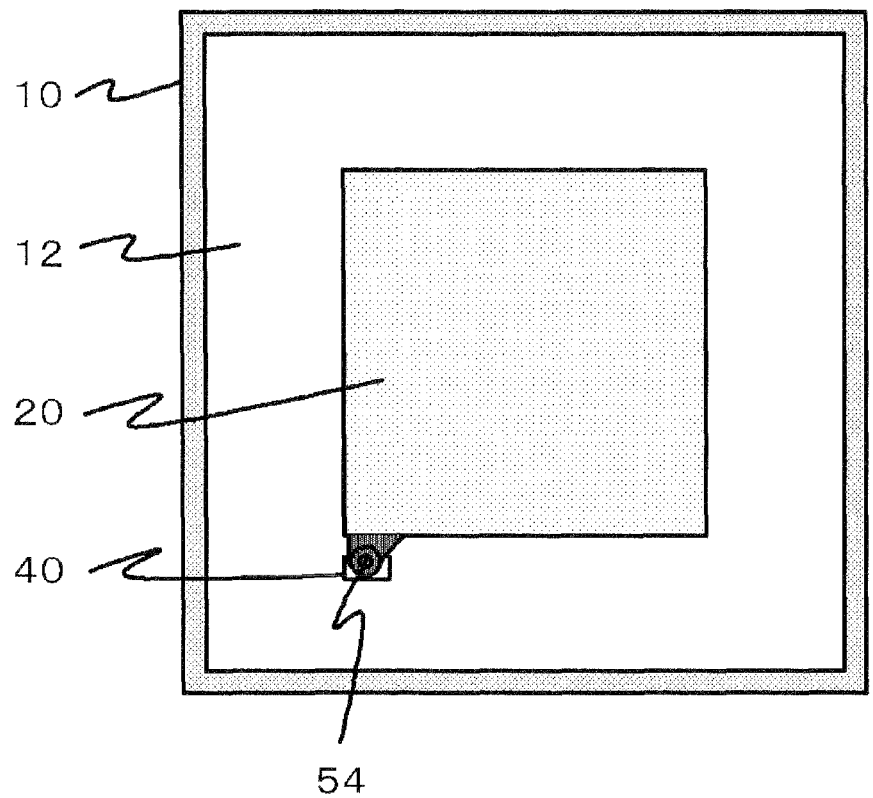
FIGS. 4A and 4B are a plan view and a cross-sectional view, respectively, both useful in describing the embodiment of the method for manufacturing the semiconductor device according to the present invention.
Figure 4B:
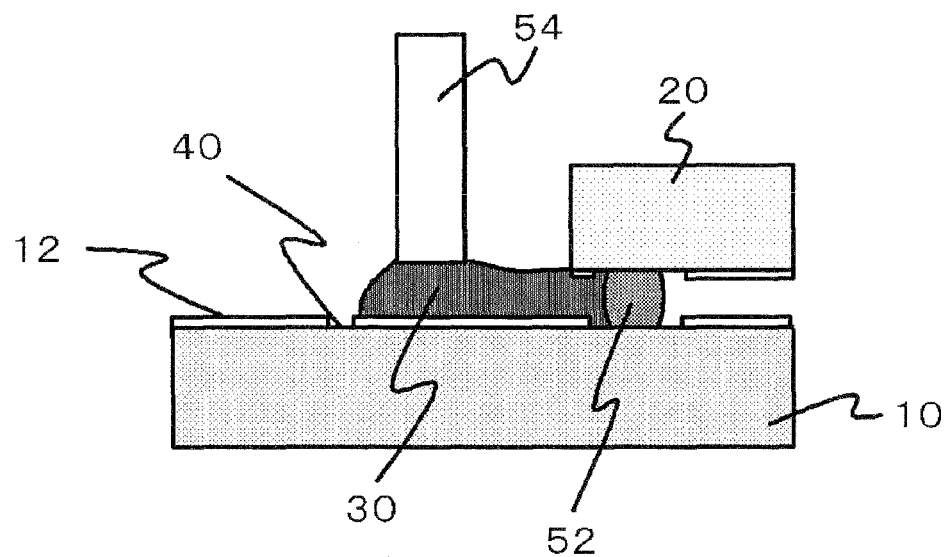

In such condition, a spreading-wet of the underfill resin 30 onto the mounting interconnect substrate 10 is dammed up with the flow-inducing section 40, so that the underfill resin 30 moves toward the semiconductor chip 20. This results in that, when a certain or greater amount of the underfill resin 30 reaches to the semiconductor chip 20, a permeation of the underfill resin 30 into the gap between the semiconductor chip 20 and the mounting interconnect substrate 10 via a capillary phenomenon is started (FIG. 4A, FIG. 4B).

Figure 5A:
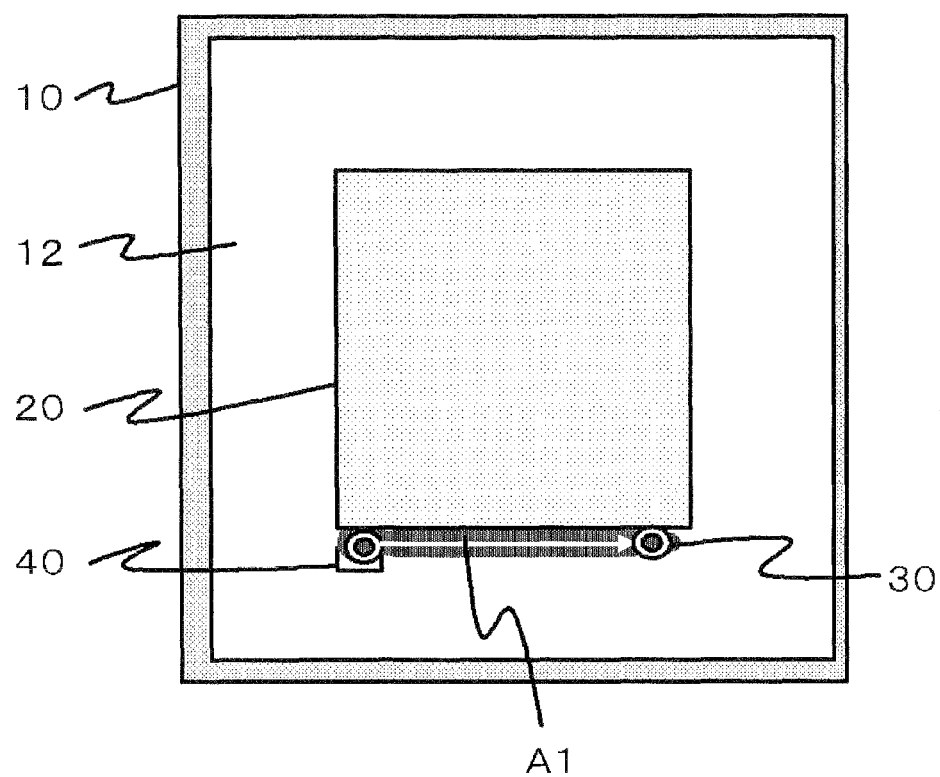
FIGS. 5A and 5B are a plan view and a cross-sectional view, respectively, both of which are useful in describing the embodiment of the method for manufacturing the semiconductor device according to the present invention.
Figure 5B:
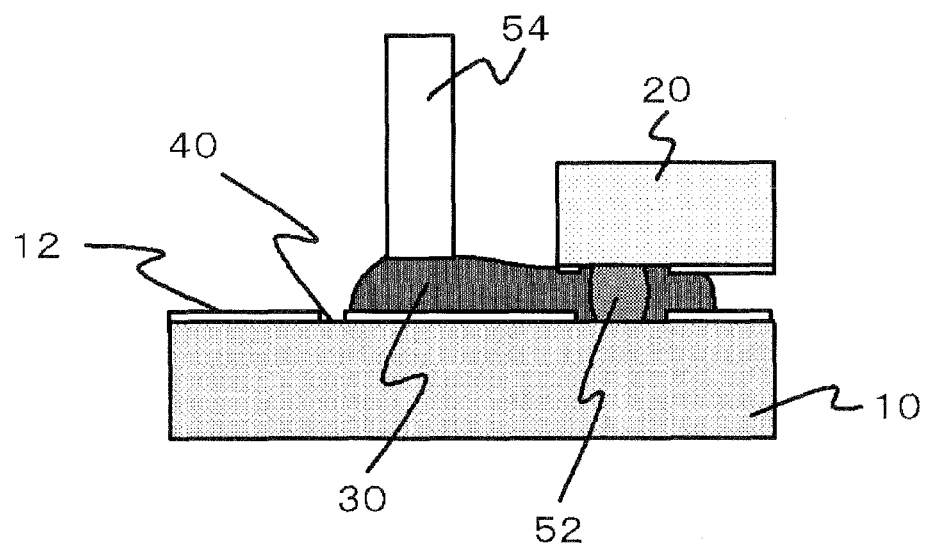
Figure 6A:
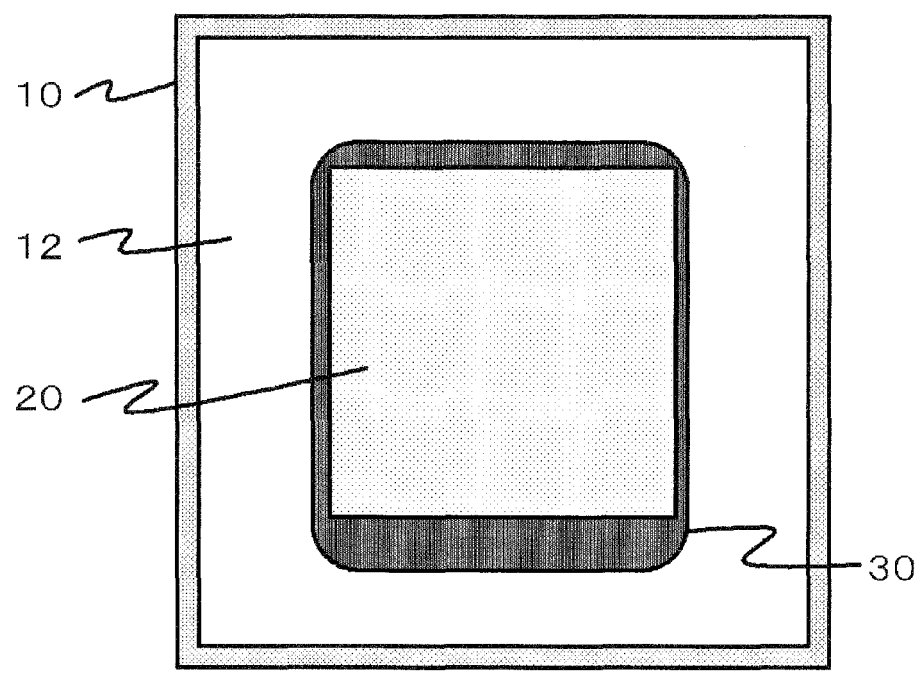
FIGS. 6A and 6B are a plan view and a cross-sectional view, respectively, both of which are useful in describing the embodiment of the method for manufacturing the semiconductor device according to the present invention.
Figure 6B:
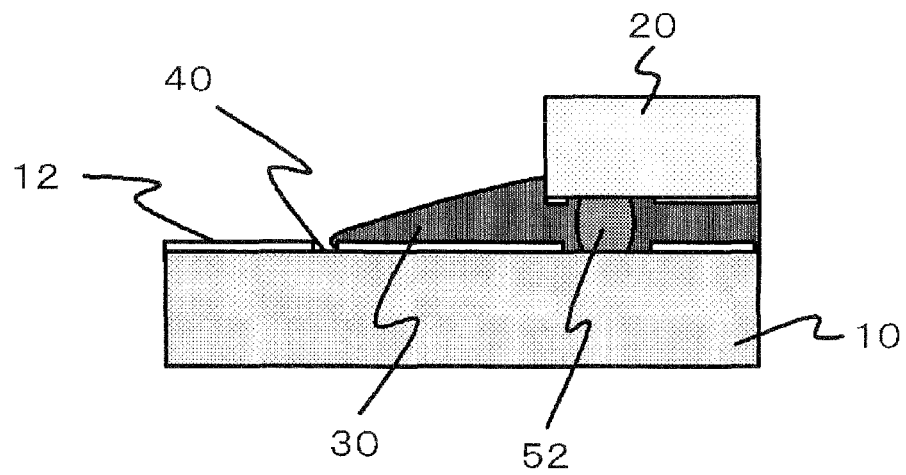

Then, the supply of the underfill resin 30 is continued while the needle 54 is moved along the side of the semiconductor chip 20 (FIG. 5A, FIG. 5B). Locus of the needle 54 is illustrated by an arrow A1 in FIG. 5A. Since a permeation with a capillary phenomenon is already started at this time, the subsequently supplied underfill resin 30 also fluidizes toward the above-described gap. Thereafter, necessary cycles of the supply of the underfill resin 30 are repeated with similar needle operations. As described above, a condition that a fillet is formed over the whole circumference portion of the semiconductor chip 20 is obtained (FIG. 6A, FIG. 6B).

Advantageous effect of the present embodiment will be described. In the present embodiment, the flow-inducing section 40 is provided in vicinity of the semiconductor chip 20 for inducing a flow of the underfill resin 30 to a gap between the mounting interconnect substrate 10 and the semiconductor chip 20. Such manner of actively supplying the underfill resin 30 to the end portion of the semiconductor chip 20 by utilizing such flow-inducing section 40 ensures a commence of a permeation of the underfill resin 30 to the above-described gap through a capillary phenomenon at the time of starting the supply of the resin.

Further, this also allows a fluidization of the subsequently supplied underfill resin 30, which is supplied after the starting the supply, along the spreading direction of the resin toward the above-described gap. Therefore, a phenomenon of causing a spreading-wet of the underfill resin 30 on the mounting interconnect substrate 10 without permeating into the above-described gap can be prevented. More specifically, it is sufficient that the underfill resin 30 flows into the above-described gap in the initial stage of supply, and once the flow of the resin is started, a certain overflow of the underfill resin 30 over the flow-inducing section 40 may not cause a problem. Thus, the semiconductor device 1 and the method for manufacturing thereof are achieved, which are adopted for sufficiently injecting an underfill resin 30.

Second Embodiment

Figure 7A:
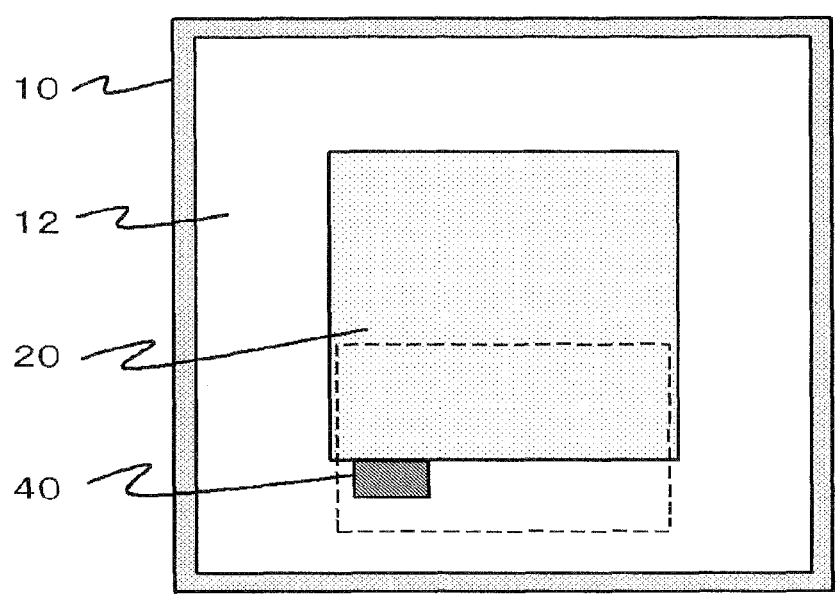
FIGS. 7A and 7B are a plan view and a cross-sectional view, respectively, both illustrating second embodiment of a semiconductor device according to the present invention.
Figure 7B:
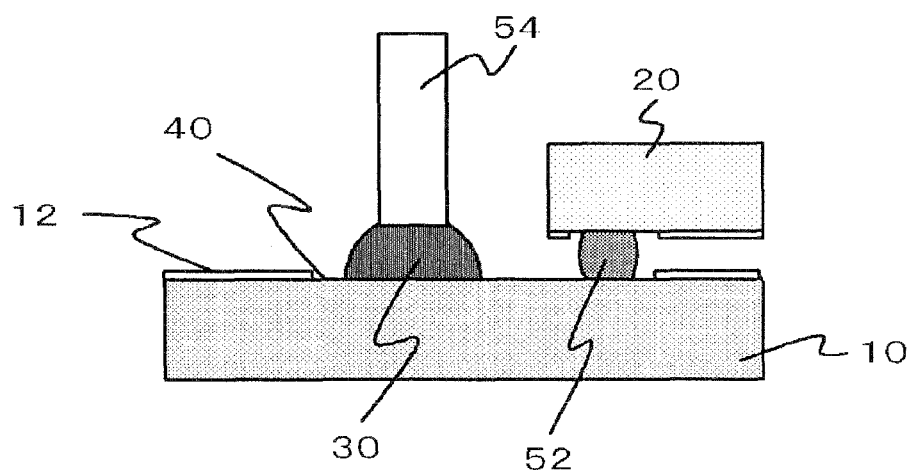
Figure 7C:
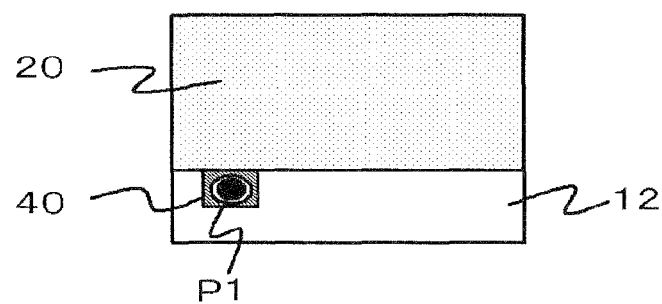
FIG. 7C is an enlarged plan view of a portion of FIG. 7A.

FIG. 7A and FIG. 7B are a plan view and a cross-sectional view, respectively, illustrating second embodiment of the present invention. FIG. 7C is an enlarged plan view of a portion (a section surrounded with a dotted line) of FIG. 7A. In the present embodiment, an opening that includes a spot P1, at which a supply of the underfill resin 30 is started, is formed in the solder resist 12 to serve as the flow-inducing section 40. Such opening reaches to a gap between the mounting interconnect substrate 10 and the semiconductor chip 20. Having such configuration, the permeation of the underfill resin 30 along the above-described opening can be achieved in the initial stage of the supply of the resin, thereby inducing a stable permeation of the resin via a capillary phenomenon. Other configurations and advantageous effects of the present embodiment are similar to that of first embodiment.

Third Embodiment

Figure 8:
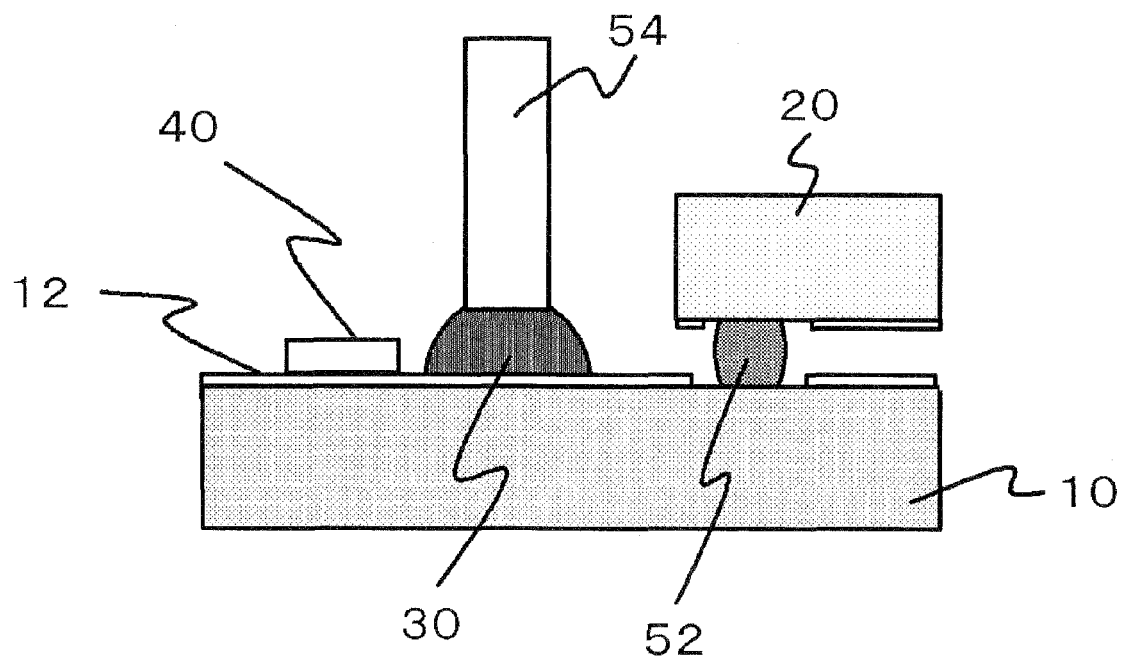
FIG. 8 is a cross-sectional view, illustrating third embodiment of the present invention.

FIG. 8 is a cross-sectional view, illustrating third embodiment of the present invention. In the present embodiment, a concave dam (protruding portion) is formed to serve as the flow-inducing section 40 in vicinity of the spot for supplying the solder resist 12. The underfill resin 30 is blocked by such dam so that the fluidization of the underfill resin 30 is oriented toward the semiconductor chip 20, thereby inducing a stable permeation of the resin via a capillary phenomenon when a supply of the resin is started. The geometry of the dam may be preferably a geometry that is capable of inducing a fluidization of the underfill resin 30 toward the semiconductor chip 20, similarly as illustrated in first embodiment. Other configurations and advantageous effects of the present embodiment are similar to that of first embodiment.

Fourth Embodiment

Figure 9:
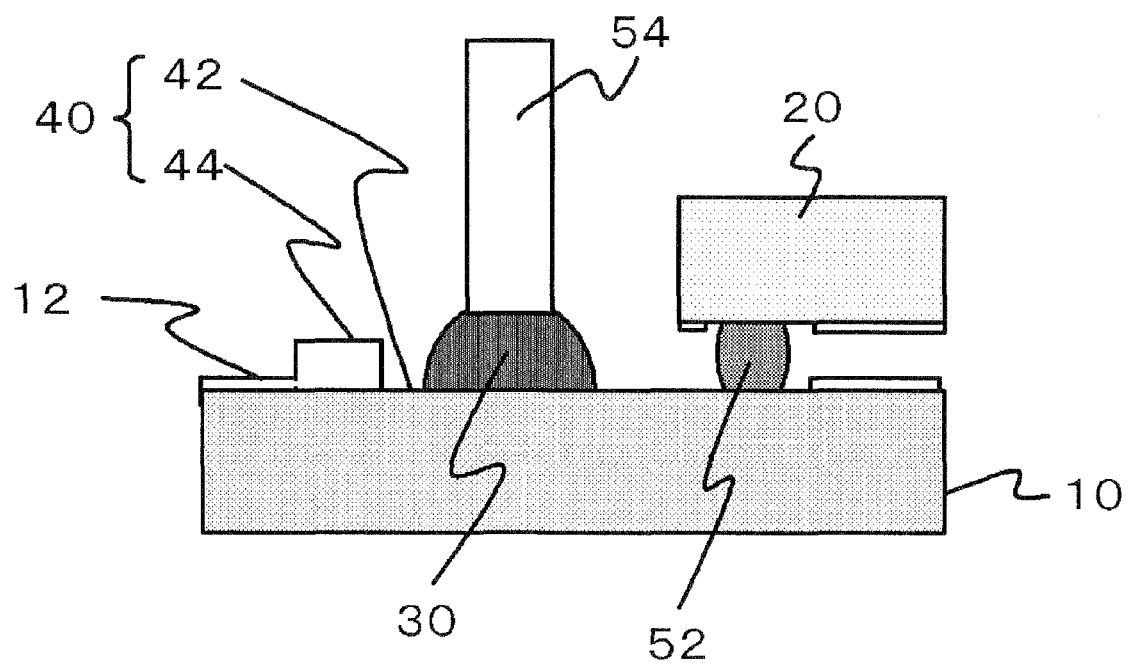
FIG. 9 is a cross-sectional view, illustrating fourth embodiment of the present invention.

FIG. 9 is a cross-sectional view, illustrating fourth embodiment of the present invention. A concave dam 44 (protruding portion) is formed in a circumference portion of the opening 42 in a side opposing the semiconductor chip 20. The flow-inducing section 40 is configured of the opening 42 and the dam 44. Having such configuration, the resin is stemmed by the flow-inducing section 40 with further certainty to cause a fluidization of the underfill resin 30 toward the semiconductor chip 20, thereby inducing a stable permeation of the resin via a capillary phenomenon when a supply of the resin is started. Geometries of the opening 42 and the dam 44 may be preferably geometries that are capable of inducing a fluidization of the underfill resin 30 toward the semiconductor chip 20, similarly as illustrated in first and second embodiments. Other configurations and advantageous effects of the present embodiment are similar to that of first embodiment.

Figure 10:
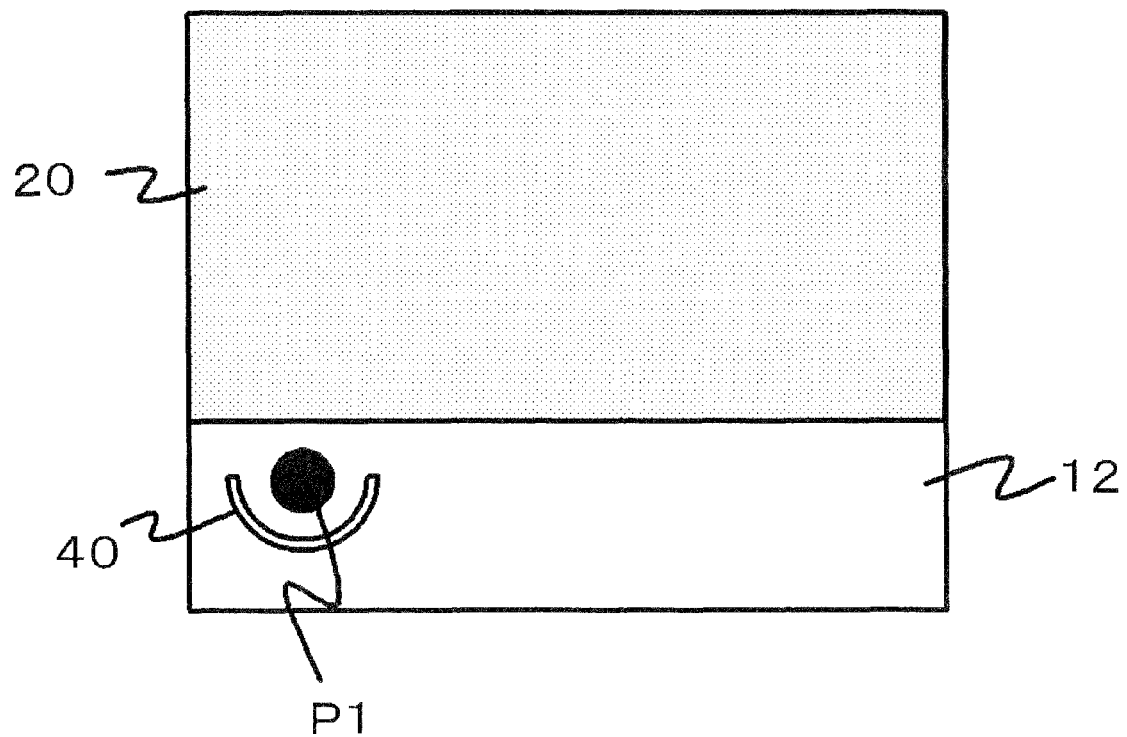
FIG. 10 is a plan view, which is useful in describing a modified embodiment.
Figure 11:
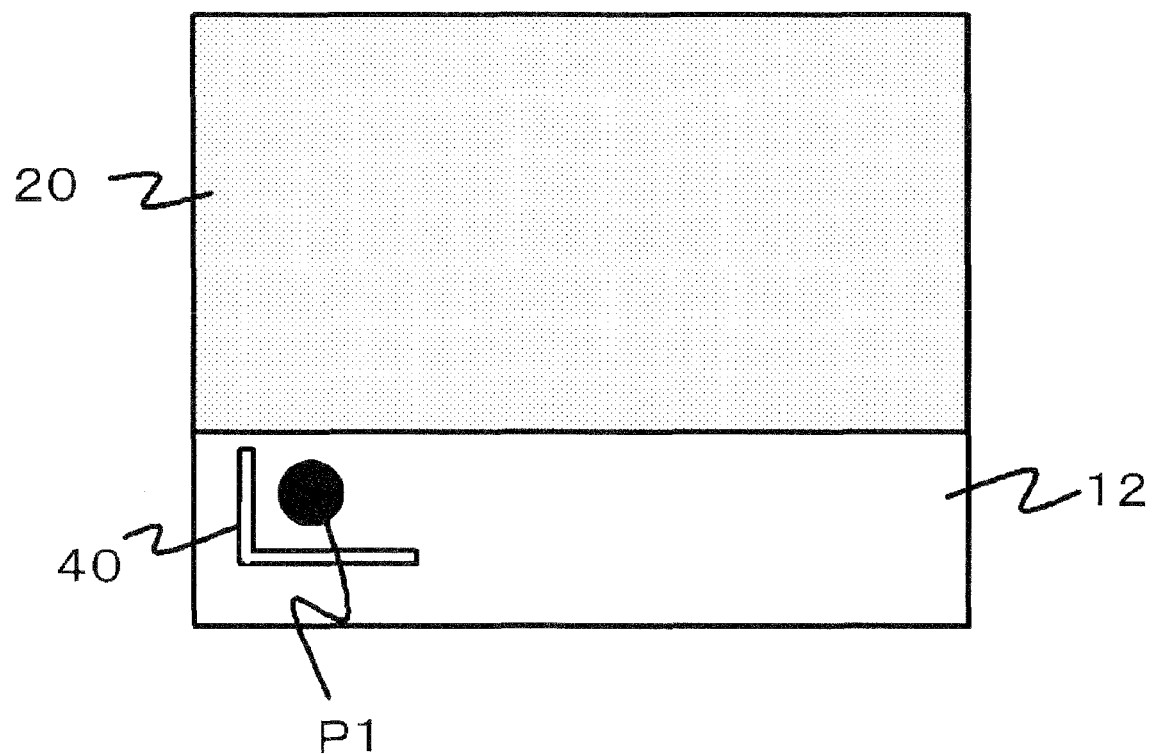
FIG. 11 is a plan view, which is useful in describing a modified embodiment.
Figure 12:
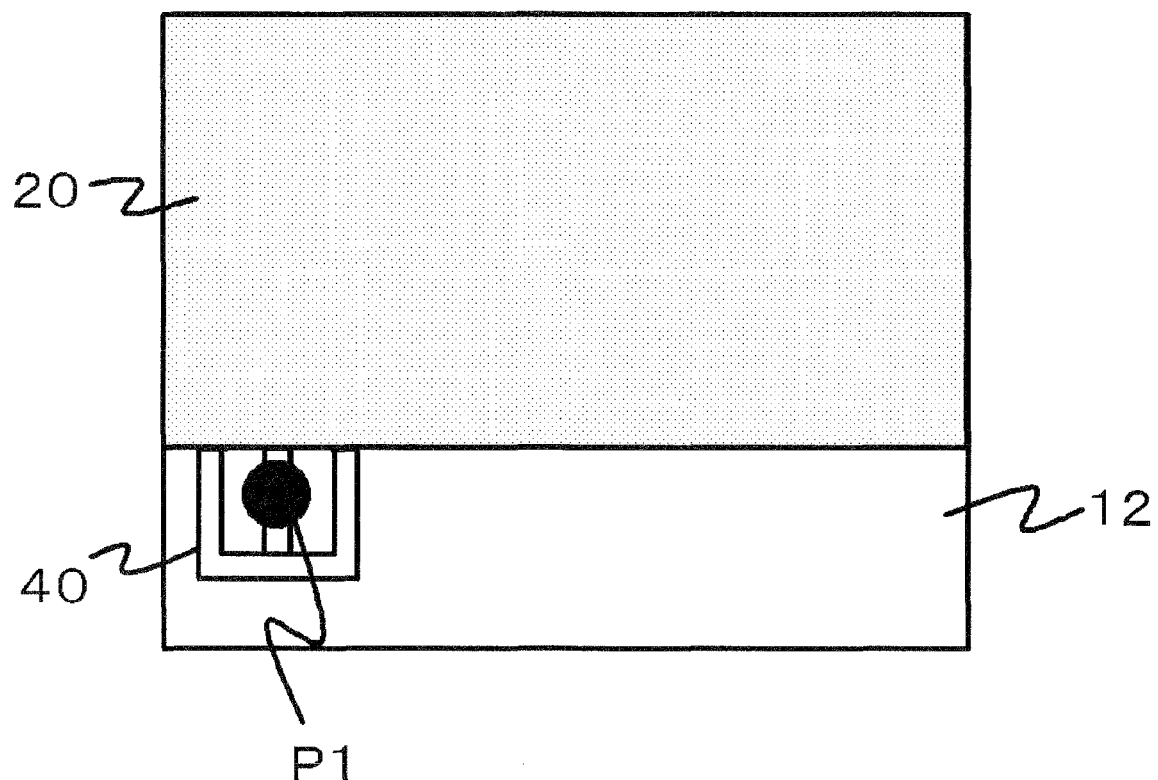
FIG. 12 is a plan view, which is useful in describing a modified embodiment.
Figure 13:
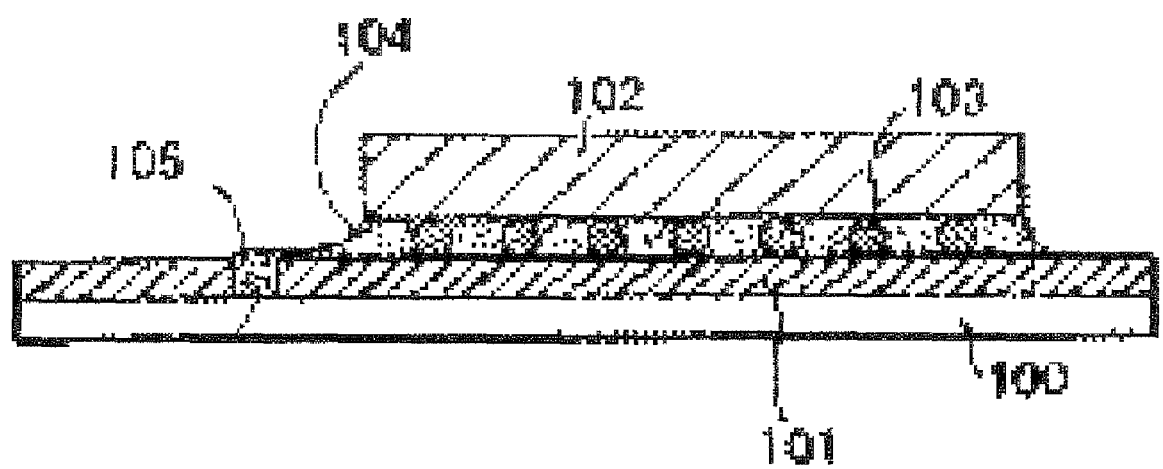
FIG. 13 is a cross-sectional view, illustrating a conventional semiconductor device.
Figure 14:
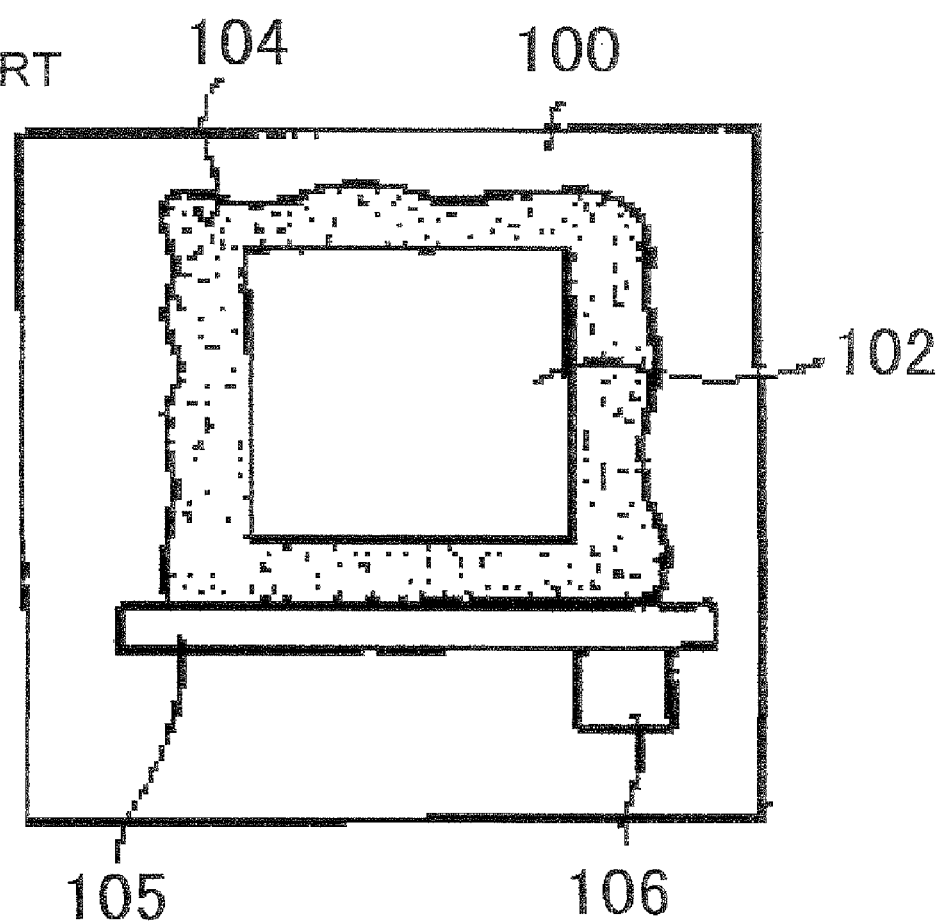
FIG. 14 is a cross-sectional view, illustrating a conventional semiconductor device.
Figure 15:
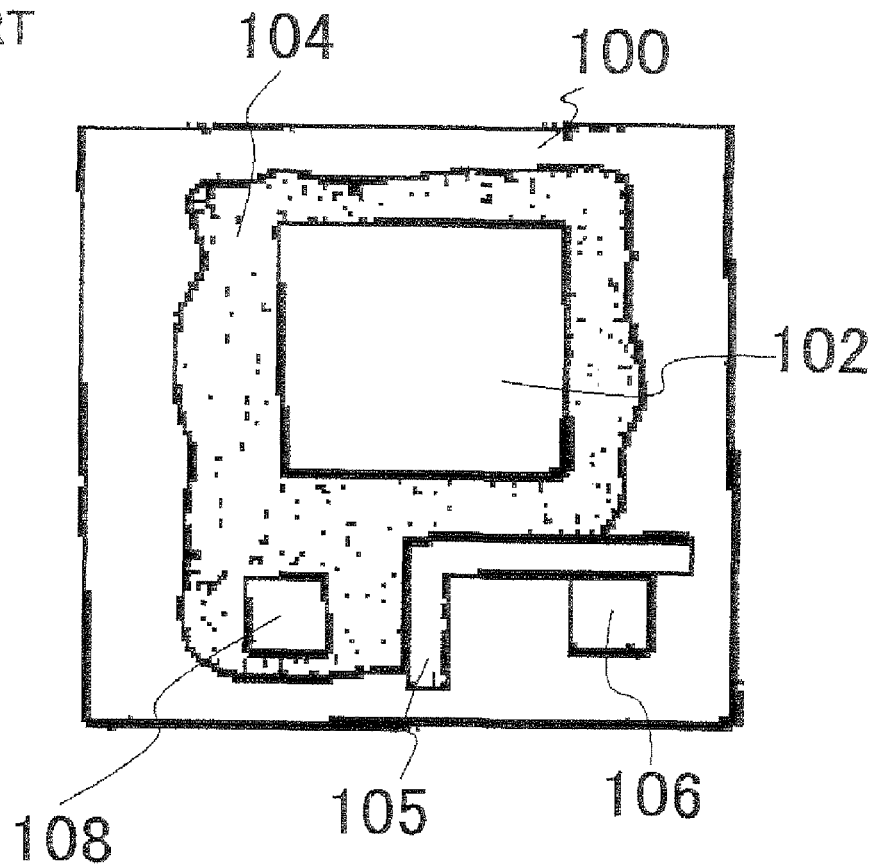
FIG. 15 is a cross-sectional view, illustrating a conventional semiconductor device.

The semiconductor devices and the methods for manufacturing thereof according to the present invention are not limited to the above-described embodiments, and various types of modifications are also available. For example, suitable two-dimensional geometry of the flow-inducing section 40 may include geometries show in FIG. 10 to FIG. 12, in addition to that shown in the above-described embodiments. These diagrams of are plan views corresponding to FIG. 7C. In FIG. 10, the flow-inducing section 40 has a two-dimensional geometry that corresponds to a portion of a circle, and an open-circuit of the flow-inducing section 40 is oriented toward the semiconductor chip 20. In FIG. 11, the flow-inducing section 40 has a two-dimensional geometry that is equivalent to two sides of a rectangle, an open-circuit of which is oriented toward the semiconductor chip 20. Further, in FIG. 12, a portion of the flow-inducing section 40 extends across the spot P1 for starting a supply of the resin to reach to the gap between the mounting interconnect substrate 10 and the semiconductor chip 20. All of the flow-inducing sections 40 shown in FIG. 10 to FIG. 12 have two-dimensional geometries that have concave portions in the side of the semiconductor chip 20.

Further, while the interconnect substrate has been exemplified as the first electronic component in the above-described embodiment, the first electronic component may be a semiconductor chip. More specifically, the semiconductor device according to the present invention is not limited to the flip-chip device, and may also be applicable to chip-on-chip devices.

It is apparent that the present invention is not limited to the above embodiment, and may be modified and changed without departing from the scope and spirit of the invention.

What is claimed is:
1. A semiconductor device, comprising:
a first electronic component;
a second electronic component mounted on said first electronic component;
an underfill resin provided in a gap between said first and said second electronic components; and
a flow-inducing section provided in vicinity of said second electronic component on said first electronic component, said flow-inducing section being capable of inducing a flow of said underfill resin into said gap,
wherein said flow-inducing section has a two-dimensional geometry that is equivalent to a portion of a circle, and wherein an open-circuit of said flow-inducing section is oriented toward said second electronic component.

2. The semiconductor device as set forth in claim 1, wherein a solder resist is provided on said first electronic component, and said flow-inducing section is formed as an opening of said solder resist.

3. The semiconductor device as set forth in claim 2, wherein said opening reaches to said gap.

4. The semiconductor device as set forth in claim 2, further comprising a protruding portion provided in a circumference portion of said opening in a side opposite to said second electronic component.

5. The semiconductor device as set forth in claim 1, wherein a solder resist is provided on said first electronic component, and said flow-inducing section is formed as a protruding portion in said solder resist.

6. The semiconductor device as set forth in claim 1, wherein said flow-inducing section has a two-dimensional geometry, in which a concave portion is included in a side of said second electronic component.

7. The semiconductor device as set forth in claim 1, wherein said flow-inducing section is provided so as to surround a spot where a supply of said underfill resin is started, from a side opposite to said second electronic component.

8. The semiconductor device as set forth in claim 1, wherein said flow-inducing section is provided in vicinity of a corner of said second electronic component.

9. A method for manufacturing the semiconductor device as set forth in claim 1, comprising:

mounting a second electronic component on a first electronic component; and supplying said underfill resin from a spot between said second electronic component and said inflow inducing section to fill a gap between said first and said second electronic components with the underfill resin, wherein said inflow inducing section has a two-dimensional geometry that is equivalent to a portion of a circle or a rectangle, and wherein an open-circuit of said flow-inducing section is oriented toward said second electronic component.

10. A semiconductor device, comprising:

a first electronic component;

a second electronic component mounted on said first electronic component;

an underfill resin provided in a gap between said first and said second electronic components; and a flow-inducing section provided in vicinity of said second electronic component on said first electronic component, said flow-inducing section being capable of inducing a flow of said underfill resin into said gap, wherein said flow-inducing section has a two-dimensional geometry that is equivalent to a portion of a rectangle, and wherein an open-circuit of said flow-inducing section is oriented toward said second electronic component.

11. The semiconductor device as set forth in claim 10, wherein said portion of said rectangle is two sides of said rectangle.

12. The semiconductor device as set forth in claim 10, wherein said portion of said rectangle is three sides of said rectangle.

* * * * *